(12) United States Patent
Riedlinger et al.

(10) Patent No.: US 6,226,217 B1
(45) Date of Patent: May 1, 2001

(54) REGISTER STRUCTURE WITH A DUAL-ENDED WRITE MECHANISM

(75) Inventors: Reid James Riedlinger; Donald R Weiss, both of Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/507,207

(22) Filed: Feb. 18, 2000

(51) Int. Cl.[7] ..................................................... G11C 8/00
(52) U.S. Cl. ..................... 365/230.05; 365/154; 365/156
(58) Field of Search ................................. 365/156, 154, 365/230.05

(56) References Cited

U.S. PATENT DOCUMENTS

| | | | | |
|---|---|---|---|---|
| 5,734,613 | * | 3/1998 | Gibson | 365/230.05 |
| 5,959,931 | * | 9/1999 | Ueda | 365/230.05 |
| 6,044,034 | * | 3/2000 | Katakura | 365/230.05 |
| 6,104,663 | * | 8/2000 | Kablanian | 365/230.05 |

* cited by examiner

Primary Examiner—Son T. Dinh

(57) ABSTRACT

A system and method are disclosed which provide a register structure enabling a dual-ended write thereto with a minimum amount of high-level metal tracks and components, thereby minimizing the amount of surface area required for such register structure. A data carrier (e.g., a BIT line) is utilized to carry a data value desired to be written from a port to a memory cell of a register structure. Such a data carrier may be implemented as a high-level metal track that spans multiple register structures to enable a port the capability of writing to such multiple register structures. Also, a line for triggering a write operation for a port (e.g., a WORD line) is implemented, and such a triggering line may be implemented as a high-level metal track. A preferred embodiment provides a register structure that includes a dual-ended write mechanism. In a preferred embodiment, a complementary data carrier for a port is generated locally within a register structure. Thus, a preferred embodiment minimizes the number of high-level metal tracks required because a complementary data carrier for each port is not required to be implemented as a high-level metal track. Furthermore, a preferred embodiment generates a complementary data carrier for a port locally within the register structure in a manner that does not require an inverter. More specifically, a preferred embodiment implements a NFET that is arranged in a manner to generate the necessary complementary data carrier (e.g., NBIT line) for performing a dual-ended write.

20 Claims, 2 Drawing Sheets

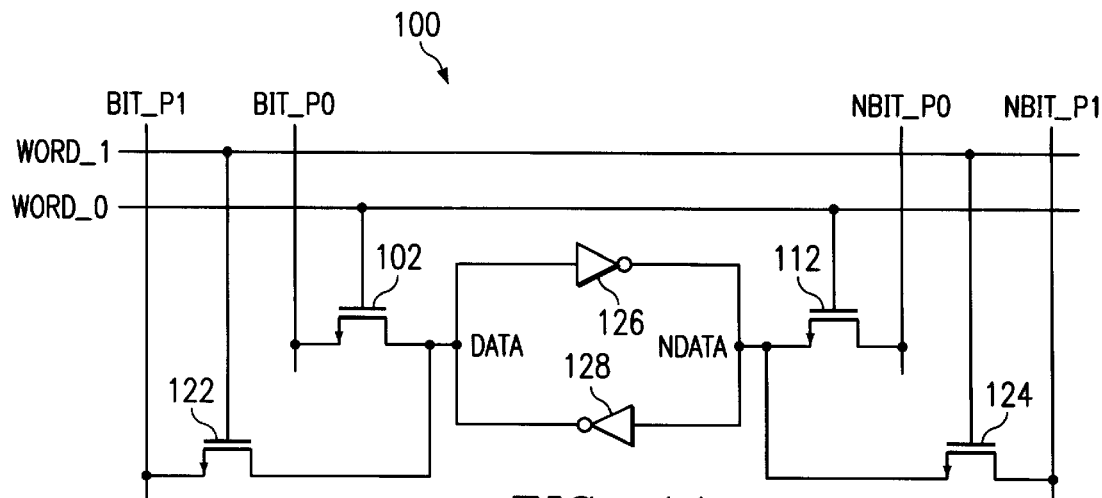
FIG. 1A
*(PRIOR ART)*
FIG. 1B
*(PRIOR ART)*
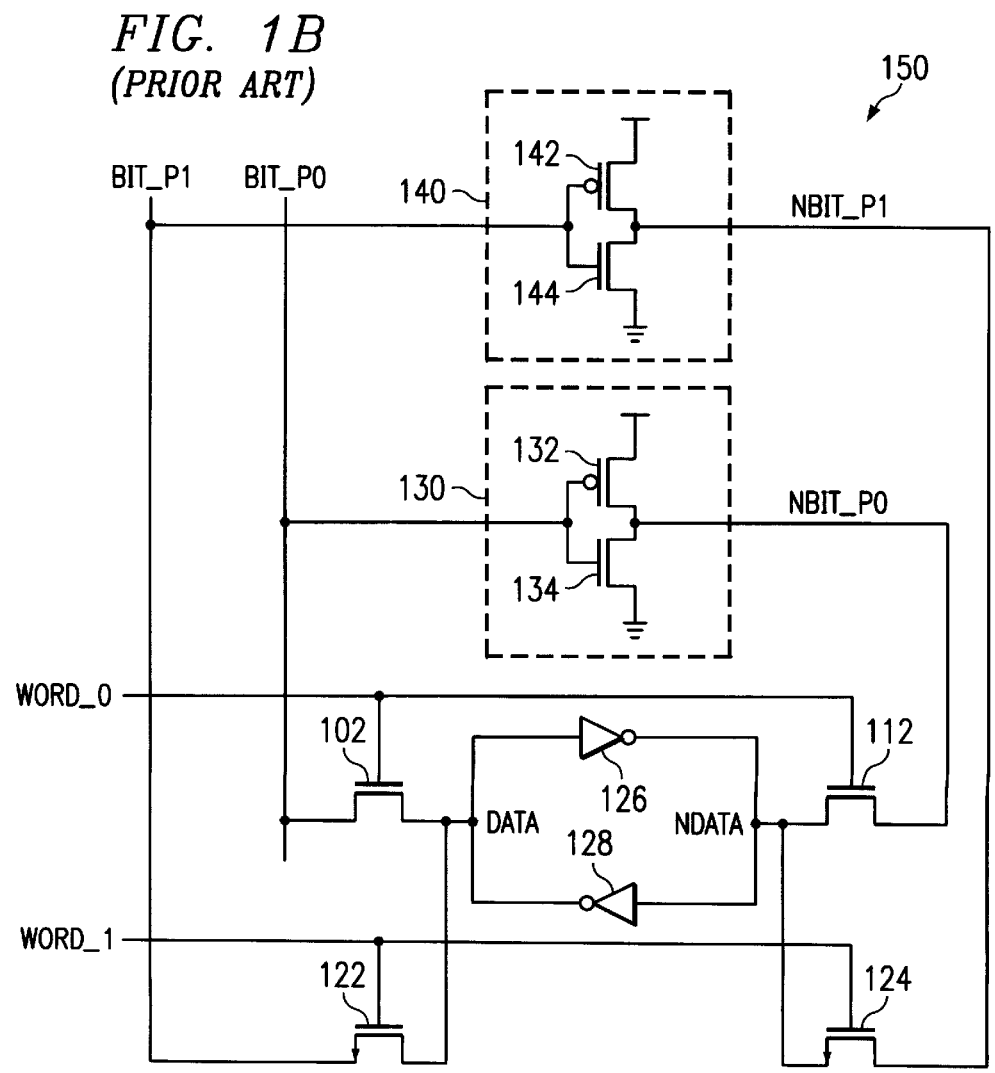

REGISTER STRUCTURE WITH A DUAL-ENDED WRITE MECHANISM

RELATED APPLICATIONS

This application is related to co-pending and commonly assigned patent application Ser. No. 09/505,561 entitled "SYSTEM AND METHOD FOR ENABLING/ DISABLING SRAM BANKS FOR MEMORY ACCESS," and co-pending and commonly assigned U.S. Patent application Ser. No. 09/507,333 entitled "MULTI-PORTED REGISTER STRUCTURE UTILIZING A PULSE WRITE MECHANISM," the disclosures of which are hereby incorporated herein by reference.

TECHNICAL FIELD

This invention is related in general to a register structure, and in specific to a register structure having a dual-ended write mechanism that requires a small amount of circuitry to enable a port coupled to a memory cell of the register structure to perform write operations to such memory cell.

BACKGROUND

Computer systems may employ a multi-level hierarchy of memory, with relatively fast, expensive but limited-capacity memory at the highest level of the hierarchy and proceeding to relatively slower, lower cost but higher-capacity memory at the lowest level of the hierarchy. At the highest level of the memory hierarchy, computers commonly have register structures implemented, which are typically limited in capacity but provide very fast access thereto. Such register structures may be referred to as "register files," and various such register structures may be implemented for a system, such as an integer register structure and floating point register structure. A register structure enables high speed memory access, and is typically capable of satisfying a memory access request (e.g., a read or write request) in one clock cycle (i.e., one processor clock cycle). Various lower levels of memory may be implemented including a small fast memory called a cache, either physically integrated within a processor or mounted physically close to the processor for speed, as well as the main memory (e.g., the disk drive) of a computer system.

Static random access memory (SRAM) is typically implemented for register structures of a computer system for storing data therein. Generally, SRAM memory is a type of memory that is very reliable and very fast. Unlike dynamic random access memory (DRAM), SRAM does not need to have its electrical charges constantly refreshed. As a result, SRAM memory is typically faster and more reliable than DRAM memory. Unfortunately, SRAM memory is generally much more expensive to produce than DRAM memory. Due to its high cost, SRAM is typically implemented only for the most speed-critical parts of a computer, such as for register structures. However, SRAM memory may be implemented for other memory components of a computer system, as well. Moreover, types of memory other than SRAM (e.g., other types of RAM) may be implemented within a computer system for a register structure.

To enable greater efficiency in processing instructions, multiple ports are commonly implemented within a computer system. For instance, multiple ports may be implemented such that each port is capable of satisfying a memory access request (e.g., a read or write instruction) in parallel with the other ports satisfying such a memory access request. Accordingly, various register structures have been developed to enable access thereto by multiple ports. That is, multi-ported register structures are commonly implemented in the prior art to enable multiple ports to access the register structure to satisfy a memory access request.

Register structures of the prior art are typically implemented with dual-ended writes through an N-channel field effect transistor (NFET) into a latch. FIG. 1A illustrates a typical dual-ended SRAM cell 100 of the prior art. The exemplary implementation of FIG. 1A illustrates a multi-ported SRAM structure, which comprises a typical SRAM cell comprising cross-coupled inverters 126 and 128 for storing data (i.e., for storing one bit of data). Additionally, NFETs 102 and 112 are provided, which enable writes from a first port (i.e., port 0). That is, a write is accomplished to the SRAM cell by passing a voltage level across NFETs 102 and 112 into the cross-coupled inverters 126 and 128. Also, a second port (i.e., port 1) is coupled to the SRAM cell 100 by implementing NFETs 122 and 124, which enable writes from the second port to the SRAM cell 100. The multi-ported SRAM structure 100 of FIG. 1A is well-known in the art and is commonly implemented in integrated circuits of the prior art. The SRAM cell 100 of FIG. 1A is a memory cell capable of storing one bit of data (i.e., a logic 1 or a logic 0). Thus, many of such SRAM cells 100 are typically implemented within a system to provide the desired amount of SRAM memory.

Either of the two ports (i.e., port 0 and port 1) coupled to the SRAM cell 100 may write data into the cell to satisfy a memory write request. As shown, BIT_P0, NBIT_P0, and WORD_0 lines are implemented to enable a write for port 0 to the SRAM cell 100, and BIT_P1, NBIT_P1, and WORD_P lines are implemented to enable a write for port 1 to the SRAM cell 100. The BIT_P0 and BIT_P1 lines may be referred to herein as data carriers for port 0 and port 1, respectively, and NBIT_P0 and NBIT_P1 may be referred to herein as complementary data carriers for port 0 and port 1, respectively. The operation of this prior art implementation is well known in the prior art, and therefore will be described only briefly herein. Typically, the BIT_P0 and BIT_P1 lines are held to a high voltage level (i.e., a logic 1), unless one of them is actively pulled to a low voltage level (i.e., a logic 0). For instance, when writing data from port 0 to the SRAM cell 100, the BIT_P0 line is actively driven low by an outside source (e.g., an instruction being executed by the processor) if the outside source desires to write a 0 to the SRAM cell 100, and the NBIT_P0 line is held to a high voltage level (the opposite of BIT_P0). Otherwise, if an outside source desires to write a 1 to the SRAM cell 100, the BIT_P0 line remains high and the NBIT_P0 line is pulled low. Thereafter, the WORD_0 line is fired (e.g., caused to go to a high voltage level), at which time the value of the BIT_P0 line is written into the SRAM cell 100. More specifically, the voltage level of BIT_P0 is transferred across NFET 102 and the voltage level of NBIT_P0 is transferred across NFET 112 to accomplish a write of the value of BIT_P0 to DATA of the cross-coupled inverters 126 and 128.

A similar operation is performed when writing data from port 1 to the SRAM cell 100. For instance when writing data from port 1 to the SRAM cell 100, the BIT_P1 line is actively driven low by an outside source (e.g., an instruction being executed by the processor) if the outside source desires to write a 0 to the SRAM cell 100, and the NBIT_P1 line is held to a high voltage level (the opposite of BIT P1). Otherwise, if an outside source desires to write a 1 to the SRAM cell 100, the BIT_P1 line remains high and the NBIT_P1 line is pulled low. Thereafter, the WORD_1 line is fired, at which time the value of the BIT_P1 line is written into the SRAM cell 100. More specifically, the voltage level of BIT_P1 is transferred across NFET 122 and the voltage level of NBIT_P1 is transferred across NFET 124 to accomplish a write of the value of BIT_P1 to DATA of the cross-coupled inverters 126 and 128. The data value written into the SRAM cell 100 (e.g., a logic 0 or logic 1) is shown as DATA in FIG. 1A, and the complement of such value is shown as NDATA. The SRAM register structure illustrated in FIG. 1A is referred to as a dual-ended write structure because it utilizes two lines to write a data value into the SRAM cell 100. For instance, it requires both a data carrier and a complementary data carrier (e.g., BIT_P0 and NBIT_P0) to write a value to the SRAM cell 100 from port 0, and it requires both a data carrier and a complementary data carrier (e.g., BIT_P1 and NBIT_P1) to write a value to the SRAM cell 100 from port 1.

Typically, multiple SRAM cells, such as SRAM cell 100, are connected to a single BIT line (e.g., BIT_P0) and a single NBIT line (e.g., NBIT_P0). Accordingly, a single BIT line may be utilized to carry data to/from multiple ones of SRAM cells 100 for a port. Therefore, even though only SRAM cell 100 is shown, it should be understood that many such SRAM cells may be connected to the BIT_P0 and NBIT_P0 lines for port 0, as well as to the BIT_P1 and NBIT_P1 lines for port 1, to form a group of SRAM cells. Additionally, it should be recognized that additional ports may be coupled to the SRAM cell 100. Thus, even though only two ports (port 0 and port 1) are shown as being coupled to SRAM cell 100, SRAM cell 100 may have any number of ports coupled thereto. In general, it is desirable to have a large number of ports coupled to each SRAM cell 100 in order to increase the number of instructions that may be processed in parallel, and thereby increase the efficiency of a system.

The dual-ended register structure illustrated in FIG. 1A is problematic in that it requires an undesirably large amount of surface area for its implementation. More specifically, the dual-ended register structure of FIG. 1A requires an undesirably large amount of high-level metal tracks (or lines) to be implemented. For example, the metal tracks for implementing BIT_P0, NBIT_P0, WORD_0, BIT_P1, NBIT_P1 and WORD_1 are typically high-level metal tracks that span several register structures. Such high-level metal tracks are commonly referred to as "metal-two tracks" or "metal-three tracks," whereas lower-level metal tracks that are implemented within a single register structure, for example, are commonly referred to as "metal-one tracks." Because of the size and spacing requirements of high-level tracks, such high-level tracks often require a relatively large amount of surface area. Typically, high-level tracks consume more surface area than is required for the component parts (e.g., FETs) of a register structure. That is, a small device geometry process may be utilized for the component parts of a register structure, such as FETs, wherein the component parts may require much less surface area than the amount of surface area required for implementing the high-level metal tracks for a register structure. For example, in a small device geometry process commonly used today, component parts of a register structure may be approximately 0.18 micron in process size (i.e., the actual drawn size for the component parts). Additionally, the component parts (e.g., FETs) of a register structure may typically be implemented below the high-level metal tracks. Accordingly, the high-level tracks implemented for register structure 100 typically dictate the amount of surface area required for such register structure. As a result it becomes desirable to limit the number of high-level metal tracks that are required to be implemented in order to reduce the overall surface area required for the register structure. More specifically, it is desirable to provide an optimum number of high-level metal tracks that require the minimum amount of surface area below which the actual components of a register structure may be implemented. Ideally, the number of high-level metal tracks required for a register structure design would require no more than the surface area required to implement the actual components (e.g., FETs) of the register structure.

In the prior art implementation of FIG. 1A, three high-level lines are required to be implemented for each port that is coupled to the SRAM cell 100. As shown in FIG. 1A, high-level wires or metal traces must be implemented for three lines for port 1 (i.e., BIT_P1, NBIT_P1, and WORD_1). Therefore, if a third port were implemented for the SRAM cell 100, three additional high-level lines (i.e., BIT_P2, NBIT_P2, and WORD_2) would be required to be added to the design of FIG. 1A. As a result, the prior art multi-ported structure of FIG. 1A is undesirable because it requires an undesirably large number of high-level lines to be implemented for each port coupled to the SRAM cell 100. Thus, the prior art implementation of FIG. 1A results in an undesirably high cost and an undesirably large consumption of surface area for each port implemented therein.

Turning to FIG. 1B, a second implementation of a prior art register structure is illustrated. The exemplary implementation of FIG. 1B illustrates a multi-ported SRAM structure having two ports coupled thereto for performing write operations. The implementation of FIG. 1B utilizes a dual-ended write structure much like the register structure described above in FIG. 1A, except the register structure of FIG. 1B includes an inverter, such as inverter 130, within the individual SRAM cell 150 to locally generate a NBIT signal for a port. Accordingly, because the NBIT signal for each port is included only within the individual SRAM cell 150, the number of higher-level metal tracks required is reduced below that required for the implementation of FIG. 1A. That is, rather than a NBIT line for each port being implemented as a high-level metal track as in FIG. 1A, FIG. 1B provides a design in which the NBIT signal is implemented as a low-level metal track within the individual SRAM cell 150.

The multi-ported SRAM structure of FIG. 1B includes a typical SRAM cell 150 comprising cross-coupled inverters 126 and 128 for storing data (i.e., one bit of data) within the SRAM cell 150. As with the implementation of FIG. 1A, the structure of FIG. 1B further comprises NFETs 102 and 112, which enable writes to the memory cell from a first port (i.e., port 0). Also, a second port (i.e., port 1) is coupled to the SRAM cell 150 by implementing NFETs 122 and 124. The multi-ported SRAM structure 150 of FIG. 1B is also well-known in the art and is commonly implemented in integrated circuits of the prior art.

Either of the two ports (i.e., port 0 and port 1) coupled to the SRAM cell 150 may write data into the cell to satisfy a memory write request. As shown, high-level lines BIT_P0 and WORD_0 and low-level line NBIT_P0 are implemented to enable a write for port 0 to the SRAM cell 150, and high-level lines BIT_P1 and WORD_1 and low-level line NBIT_P1 are implemented to enable a write for port 1 to the SRAM cell 150. The operation of this prior art implementation is well known in the prior art, and therefore will be described only briefly herein. Typically, the BIT_P0 and BIT_P1 lines are held to a high voltage level (i.e., a logic 1), unless one of them is actively pulled to a low voltage level (i.e., a logic 0). For instance, when writing data from port 0 to the SRAM cell 150, the BIT_P0 line is actively driven low by an outside source (e.g., an instruction being executed by the processor) if the outside source desires to write a 0 to the SRAM cell 150, and the NBIT_P0 line is held to a high voltage level (the opposite of BIT_P0). Otherwise, if an outside source desires to write a 1 to the SRAM cell 150, the BIT_P0 line remains high and the NBIT_P0 line is pulled low. Thereafter, the WORD_0 line is fired (e.g., caused to go to a high voltage level), at which time the value of the BIT_P0 line is written into the SRAM cell 150. More specifically, the voltage level of BIT_P0 is transferred across NFET 102 and the voltage level of NBIT_P0 is transferred across NFET 112 to accomplish a write of the value of BIT_P0 to DATA of the cross-coupled inverters 126 and 128.

A similar operation is performed when writing data from port 1 to the SRAM cell 150. For instance when writing data from port 1 to the SRAM cell 150, the BIT_P1 line is actively driven low by an outside source (e.g., an instruction being executed by the processor) if the outside source desires to write a 0 to the SRAM cell 150, and the NBIT_P1 line is held to a high voltage level (the opposite of BIT_P1). Otherwise, if an outside source desires to write a 1 to the SRAM cell 150, the BIT_P1 line remains high and the NBIT_P1 line is pulled low. Thereafter, the WORD_1 line is fired, at which time the value of the BIT_P1 line is written into the SRAM cell 150. The data value written into the SRAM cell 150 (e.g., a logic 0 or logic 1) is shown as DATA in FIG. 1B, and the complement of such value is shown as NDATA. As with the register structure of FIG. 1A, the SRAM register structure illustrated in FIG. 1B is referred to as a dual-ended write structure because it utilizes two lines to write a data value into the SRAM cell 150. For instance, it requires both a data carrier and a complementary data carrier (e.g., BIT_P0 and NBIT_P0) to write a value to the SRAM cell 150 from port 0, and it requires both a data carrier and a complementary data carrier (e.g., BIT_P1 and NBIT_P1) to write a value to the SRAM cell 150 from port 1.

In this implementation, an inverter is included within the SRAM cell 150 to generate each NBIT signal locally. For example, inverter 130 is implemented to invert the BIT_P0 signal, thereby generating NBIT_P0, and inverter 140 is implemented to invert the BIT_P1 signal, thereby generating NBIT_P1. As shown in FIG. 1B, inverter 130 comprises PFET 132 and NFET 134, and inverter 140 comprises PFET 142 and 144. Accordingly, each port coupled to the register structure 150 for write operations requires an inverter, which comprises two FETs, to be implemented within the register structure 150. Thus, while the implementation of FIG. 1B reduces the number of high-level metal tracks required (e.g., by implementing the NBIT line for each port as a low-level metal track within the individual register structure 150, the implementation of FIG. 1B requires an undesirably large number of components that must be implemented within the register structure 150.

Typically, multiple SRAM cells, such as SRAM cell 150, are connected to a single data carrier line (e.g., BIT_P0). Accordingly, a single data carrier line may be utilized to carry data to/from multiple ones of SRAM cells 150 for a port. Therefore, even though only SRAM cell 150 is shown, it should be understood that many such SRAM cells may be connected to the BIT_P0 line for port 0, as well as to the BIT_P1 line for port 1, to form a group of SRAM cells. Additionally, it should be recognized that additional ports may be coupled to the SRAM cell 150. Thus, even though only two ports (port 0 and port 1) are shown as being coupled to SRAM cell 150, SRAM cell 150 may have any number of ports coupled thereto. Again, it is generally desirable to have a large number of ports coupled to each SRAM cell 150 in order to increase the number of instructions that may be processed in parallel, and thereby increase the efficiency of a system.

The dual-ended register structure illustrated in FIG. 1B is problematic in that it requires an undesirably large number of components to be implemented for each port coupled to the SRAM cell to perform write operations. In this prior art implementation, two FETs, one inverter (which comprises two additional FETs), and two high-level lines are required to be implemented for each port that is coupled to the SRAM cell 150. As shown in FIG. 1B, two FETs (i.e., NFETs 122 and 124) are required to be implemented to enable port 1 to be coupled to the SRAM cell 100 for write operations. Additionally, one inverter (i.e., inverter 140) that comprises PFET 142 and NFET 144 is required to locally generate NBIT_P1 within the register structure 150 for performing a write operation for port 1. Furthermore, high-level wires or metal traces must be implemented for two lines for port 1 (i.e., BIT_P1 and WORD_1). Therefore, if a third port were implemented for the SRAM cell 150, two additional FETs, one additional inverter, and two additional lines (i.e., BIT_P2 and WORD_2) would be required to be added to the design of FIG. 1B. As a result, the prior art dual-ended register structure of FIG. 1B is undesirable because it requires an undesirably large number of components to be implemented for each port coupled to the SRAM cell 150. In fact, the prior art implementation of FIG. 1B requires more components than is required for the implementation of FIG. 1A because FIG. 1B requires an inverter to be included for each port coupled to the SRAM cell 150 in order to generate the appropriate NBIT signals required for writing data from a port. Thus, the prior art implementation of FIG. 1B results in an undesirably high cost and an undesirably large consumption of surface area for each port implemented therein.

SUMMARY OF THE INVENTION

In view of the above a desire exists for a register structure that enables a dual-ended write in a manner that requires a minimum amount of high-level metal tracks, components and surface area. A further desire exists for a multi-ported register structure that enables multiple ports the capability of performing dual-ended write to the register structure, and a desire exists for such a multi-ported register structure that is implemented in a manner that minimizes the amount of high-level metal tracks, components, and surface area.

These and other objects, features and technical advantages are achieved by a system and method which provide a register structure enabling a dual-ended write thereto with a minimum amount of high-level metal tracks and components, thereby minimizing the amount of surface area required for such register structure. In a preferred embodiment a data carrier (e.g., a BIT line) is utilized to carry a data value desired to be written from a port to a memory cell of a register structure. In a preferred embodiment, such a data carrier may be implemented as a high-level metal track that spans multiple register structures to enable a port the capability of writing to such multiple register structures. Also, in a preferred embodiment a line for triggering a write operation for a port (e.g., a WORD line) is implemented, and such a triggering line may be implemented as a high-level metal track.

A preferred embodiment provides a register structure that includes a dual-ended write mechanism. As is well known, a dual-ended write utilizes both a data carrier (e.g., a BIT line) and a complementary data carrier (e.g., a NBIT line) to perform a write operation to a register structure. In a preferred embodiment, a complementary data carrier for a port is generated locally within a register structure. Thus, a preferred embodiment minimizes the number of high-level metal tracks required because a complementary data carrier for each port is not required to be implemented as a high-level metal track. Furthermore, a preferred embodiment generates a complementary data carrier for a port locally within the register structure in a manner that does not require an inverter. More specifically, a preferred embodiment implements a NFET that is arranged in a manner to generate the necessary complementary data carrier (e.g., NBIT line) for performing a dual-ended write. As a result, a preferred embodiment eliminates the requirement of a PFET (e.g., PFET 132 of FIG. 1B) that is typically required to form an inverter for generating a complementary data carrier locally within a register structure.

It should be appreciated that a technical advantage of one aspect of the present invention is that a register structure is provided that enables dual-ended writes in a manner that requires a few number of high-level metal tracks and requires a few number of components (e.g., FETs) to be implemented for the register structure. In a most preferred embodiment, a register structure is provided that enables dual-ended writes by implementing only two high-level metal tracks (e.g., a WORD line and a BIT line). Furthermore, in a most preferred embodiment, a register structure is provided that enables dual-ended writes by implementing only three NFETs, which enable a data value to be written to a memory cell (e.g., to cross-coupled inverters) of the register structure. A further technical advantage of one aspect of the present invention is that a register structure design enabling a dual-ended write is provided which does not require a PFET to enable such a dual-ended write. Still a further technical advantage of one aspect of the present invention is that the amount of surface area, number of components, cost, and complexity of a register structure having a dual-ended write mechanism are reduced. Additionally, because the size of a memory cell is reduced in a preferred embodiment a register structure with dual-ended write mechanism that is capable of operating at a faster speed than prior art designs is provided.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which:

FIG. 1A shows a prior art register structure that performs a dual-ended write;

FIG. 1B shows another prior art register structure that performs a dual-ended write;

DETAILED DESCRIPTION

Figure 2:
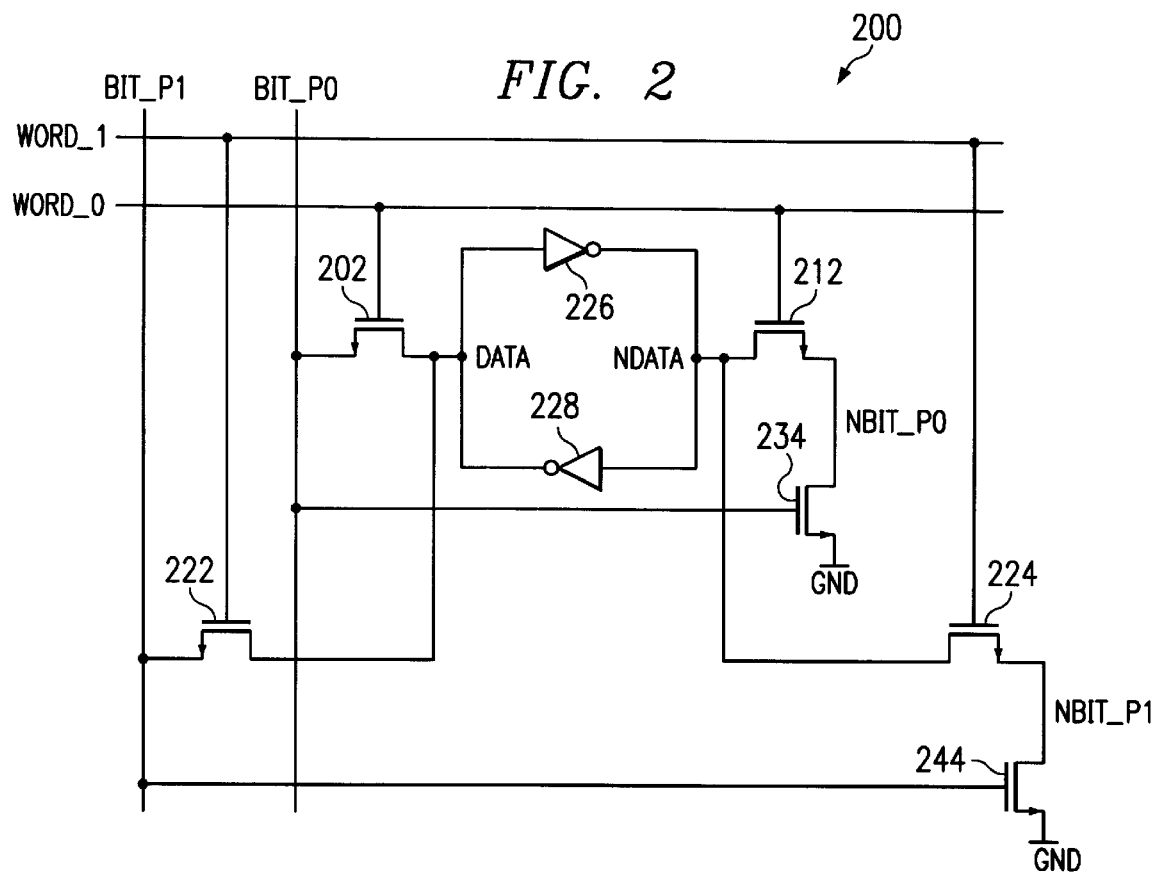
FIG. 2 shows an exemplary implementation of a preferred embodiment for a register structure enabling a dual-ended write.

Turning to FIG. 2, a preferred embodiment of the present invention is shown. As shown, FIG. 2 provides a register structure 200 that utilizes a dual-ended write mechanism. The preferred embodiment of FIG. 2 reduces the number of high-level metal tracks that are required to be implemented below that required for the prior art implementation of FIG. 1A. The dual-ended write mechanism of the preferred embodiment of FIG. 2 further utilizes less circuitry than is typically required for prior art dual-ended write mechanisms, such as that shown in FIG. 1B. The dual-ended SRAM structure of FIG. 2 includes a SRAM memory cell comprising cross-coupled inverters 226 and 228 for storing data (i.e., for storing one bit of data). Additionally, NFETs 202 and 212 are provided, which enable writes from a first port (i.e., port 0). That is, a write is accomplished to the SRAM cell by passing a voltage level across NFETs 102 and 112 into the cross-coupled inverters 126 and 128.

It should be understood that a preferred embodiment may be implemented with any number of ports coupled to the register structure 200 for performing write operations thereto. In the exemplary implementation illustrated in FIG. 1 two ports are coupled to the register structure for performing write operations thereto. Thus, a second port (i.e., port 1) is coupled to the SRAM cell 200 by implementing NFETs 122 and 124, which enable writes from the second port to the SRAM cell 200. It should be understood that any number of ports may be implemented with the capability of writing data to SRAM cell 200 in a similar manner, and any such implementation is intended to be within the scope of the present invention.

Either of the two ports (i.e., port 0 and port 1) coupled to the SRAM cell 200 may write data into the cell to satisfy a memory write request. In a preferred embodiment, a data carrier (e.g., a BIT line) for a port is used to carry a data value desired to be written from the port to the register structure 200. As illustrated in FIG. 2, a data carrier (shown as BIT_P0) and a WORD_0 line may be implemented as high-level metal tracks (e.g., metal-two or metal-three tracks) to enable a write for port 0 to the SRAM cell 200. As also illustrated, a data carrier (shown as BIT_P1) and a WORD_1 line may be implemented as high-level metal tracks to enable a write for port 1 to the SRAM cell 200.

A preferred embodiment implements a dual-ended write structure. Accordingly, both a data carrier (e.g., a BIT line) for a port and a complementary data carrier (e.g., a NBIT line) for the port are utilized to write a data value to the register structure 200. The preferred embodiment of FIG. 2 reduces the amount of surface area required for the register structure design by implementing the complementary data carrier(s) for port(s) as local, low-level metal track(s) within the individual register structure 200. As illustrated in FIG. 2, a complementary data carrier shown as NBIT_P0 is implemented as a low-level (or "local") metal track (e.g., a metal-one track) to enable a write for port 0 to the SRAM cell 200, and a complementary data carrier shown as NBIT_P1 is implemented as a low-level (or "local") metal track to enable a write for port 1 to the SRAM cell 200.

In a preferred embodiment, a single FET is implemented within the register structure 200 for each port in order to generate the complementary data carriers locally within register structure 200 for each port. For example, as shown in FIG. 2, register structure 200 includes a NFET 234 that generates the necessary NBIT_P0 signal for a dual-ended write to the SRAM cell 200 for port 0. Additionally, register structure 200 includes NFET 244 that generates the necessary NBIT_P1 signal for a dual-ended write to the SRAM cell 200 for port 1. Therefore, as shown in FIG. 2, a preferred embodiment does not require an inverter, such as inverter 130 of FIG. 1B, to generate the complementary data carrier for a dual-ended write. Thus, rather than requiring both a PFET (such as PFET 132 of FIG. 1) and a NFET (such as NFET 134 of FIG. 1) that form an inverter, such as inverter 130 of FIG. 1, a preferred embodiment requires only a NFET 234 to generate the necessary complementary data carrier for performing a dual-ended write for a port.

Accordingly, a preferred embodiment, eliminates the requirement of having both a PFET and NFET implemented to generate such a complementary data carrier, and provides an implementation that utilizes only a NFET 234 to generate a complementary data carrier for a port (e.g., NBIT_P0). Thus, a preferred embodiment requires less circuitry components to be implemented than is typically required for dual-ended write mechanisms of the prior art, such as the implementation of FIG. 1B. Furthermore, PFETs are typically much larger components than NFETs. Because a preferred embodiment eliminates the PFET typically included within an inverter for generating the necessary complementary data carrier for a dual-ended write, such as PFETs 132 and 142 of FIG. 1B, a relatively large component of prior art register structures is eliminated. As a result, a preferred embodiment enables a dual-ended write mechanism that may be implemented in a manner that consumes less surface area and is less costly than typical prior art implementations of dual-ended write mechanisms.

Figure 3:
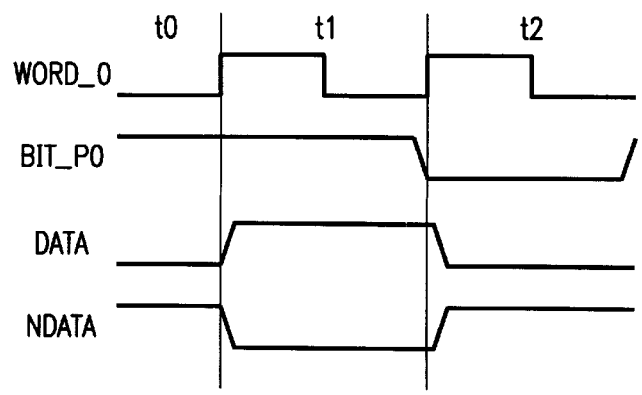
FIG. 3 shows exemplary wave forms for a write operation to a register structure of a preferred embodiment.

In a preferred embodiment, a dual-ended write is accomplished much like in traditional dual-ended write structures. The data carrier (e.g., BIT line) for a port is driven by an outside source to a desired value to be written to the register structure 200, and then the WORD line for the port is fired to write the desired data value to the register structure 200. More specifically, depending upon the value of the data carrier (e.g., BIT line) either DATA or NDATA is set to a low voltage value. Turning to FIG. 3, an exemplary operation of a dual-ended write operation of a preferred embodiment is illustrated. FIG. 3 provides wave forms illustrating the operation of a write from port 0 in a preferred embodiment. The wave forms of FIG. 3 illustrate the WORD_0, BIT_P0, DATA, and NDATA lines for a write operation of a preferred embodiment.

For example, suppose the processor is executing an instruction desiring to write a 1 into the memory cell 200, and further suppose that such 1 is to be written to the memory cell 200 via port 0. At time $T_0$ the memory cell is at a steady state, wherein WORD_0 is at a low voltage level and BIT_P0 is pre-charged to a high voltage level. In the example of FIG. 3, DATA is initially a low voltage level and NDATA is initially a high voltage level at time $T_0$. Accordingly, the register structure 200 has a logic 1 stored therein at time $T_0$. When time $T_0$ comes along, the WORD_0 line goes high, thereby opening (turning on) NFETs 202 and 212. Because a 1 is desired to be written to the register structure, the BIT_P0 line remains at a high voltage level (i.e., a 1) at time $T_1$. Because BIT_P0 is high, NFET 234 is turned on, resulting in NFETs 234 and 212 to be operating in series to generate a complementary data carrier NBIT_P0 having a low voltage value. Thus, as shown in FIG. 3, NDATA discharges to a low voltage value through the NFETs 234 and 212. As NDATA transitions to a low voltage value, it causes DATA to transition to a high voltage value, and the write operation is complete. It should be recognized that NFET 202 is not required to write a weak one to DATA of the register structure 200 in a preferred embodiment. In the above example, the NDATA line is reset to 0 causing the DATA line to be a 1 during time $T_1$, which is the value intended to be written to the register structure.

As a further example, suppose now that the processor is executing an instruction desiring to write a 0 into the memory cell 200, and further suppose that such 0 is to be written to the memory cell 200 via port 0. Accordingly, because a 0 is desired to be written to the register structure, the BIT_P0 line is discharged to a low voltage level (i.e., a logic 0). At time $T_2$, the WORD_0 line goes high, thereby opening (turning on) NFETs 202 and 212. Because a 0 is desired to be written to the register structure, the BIT_P0 line is set to a low voltage level (i.e., a 0) at time $T_2$. Because BIT_P0 is low, NFET 234 is not turned on. Since BIT_P0 is low, the NFET 202 discharges the DATA line (i.e., a charge is transferred across NFET 202) to a low voltage level, which in turn causes the NDATA line to transition to a high voltage level. As soon as the NDATA line transitions to a high voltage level, the write operation is complete. Therefore, during time $T_2$ the DATA line is reset to 0 causing the NDATA line to be a 1, which results in the value intended to be written to the register structure (i.e., a logic 0) to be written to the DATA line of the cross-coupled inverters 226 and 228. Once the write operation is complete, the BIT_P0 line is again pre-charged to a high voltage value in a preferred embodiment.

A preferred embodiment provides a register structure having a dual-ended write mechanism that requires less components, less high-level wires, less surface area, less cost, and less complexity than typical register structures of the prior art having dual-ended write mechanisms. A preferred embodiment provides a register structure design in which a relatively few number of high-level metal tracks are required. For instance, a preferred embodiment utilizes a fewer number of high-level metal tracks than is required for the prior art implementation of FIG. 1A. As an example, suppose four ports are coupled to the register structure for performing dual-ended writes thereto. In the prior art implementation of FIG. 1A, three high-level metal tracks (e.g., a BIT line, NBIT line, and WORD line) are required to be implemented for each port for a total of 12 high-level metal tracks. However, in a preferred embodiment, only two high-level metal tracks are implemented for port (e.g., a BIT line and a WORD line) for a total of eight high-level metal tracks. Such a reduction in the number of high-level metal tracks results in less surface area required for the register structure implementation.

As discussed above, to reduce the number of high-level metal tracks required in the register structure design, a preferred embodiment a complementary data carrier (e.g., NBIT) that is used in performing a dual-ended write for a port is generated locally within the register structure design. As a result, the complementary data carrier line (e.g., NBIT line) is not required to be implemented as a high-level metal track, which reduces the amount of surface area required for the register structure. Additionally, a preferred embodiment provides a register structure design in which a relatively few number of components are required to be implemented within the register structure. For instance, a preferred embodiment utilizes a fewer number of components than are required for the prior art implementation of FIG. 1B. That is, a preferred embodiment does not require an inverter to generate the complementary data carrier (e.g., NBIT) for a port. More specifically, the PFET that is included in an inverter for generating a complementary data carrier in prior art designs is eliminated. Because such a PFET is typically a relatively large component, an increased savings in surface area, cost, and complexity of the register design is recognized in a preferred embodiment. Furthermore, eliminating the PFET component results in an increase in the speed of the circuitry of a preferred embodiment. As an example, suppose four ports are coupled to the register structure for performing dual-ended writes thereto. In the prior art implementation of FIG. 1B, an inverter that comprises a PFET and NFET is required to be implemented to generate a complementary data carrier for each port for a total of four inverters (i.e., four PFETs and four NFETs). However, in a preferred embodiment, only an NFET is required to be implemented to generate a complementary data carrier for each port.

Multiple register structures, such as SRAM cell 200 of FIG. 2, may be connected to a single data carrier line (e.g., BIT_P0). Accordingly, a single data carrier line may be utilized to carry data to/from multiple ones of SRAM cells 200 for a port. Therefore, even though only SRAM cell 200 is shown, it should be understood that many such SRAM cells may be connected to the BIT_P0 line for port 0, as well as to the BIT_P1 line for port 1, to form a group of SRAM cells. Additionally, it should be recognized that additional ports may be coupled to the SRAM cell 200. Thus, even though only two ports (port 0 and port 1) are shown as being coupled to SRAM cell 200, SRAM cell 200 may have any number of ports coupled thereto, and any such implementation is intended to be within the scope of the present invention. That is, any number of ports (e.g., from one port to N ports) may be implemented in a preferred embodiment, and any such implementation is intended to be within the scope of the present invention. In general, it is desirable to have a large number of ports coupled to each SRAM cell 200 in order to increase the number of instructions that may be processed in parallel, and thereby increase the efficiency of a system. Furthermore, it should be understood that a register structure of a preferred embodiment may be implemented within any type of computer system, including but not limited to a personal computer (PC), laptop computer, and personal data assistant (e.g., a palmtop PC). Moreover, it should be understood that a register structure of a preferred embodiment may be implemented within any type of device that includes a register structure (e.g., that includes a CMOS SRAM structure), including but not limited to telephones, televisions, VCRs, DVDs, automobile systems, and video games.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of performing a dual-ended write operation to a register structure, said method comprising:
   setting a data carrier to a desired value to be written to a memory cell of said register structure;
   generating a complementary data carrier locally within said register structure, wherein an inverter is not required for said generating step; and
   using said data carrier and said complementary data carrier to perform a dual-ended write to said memory cell of said register structure.

2. The method of claim 1 wherein a PFET is not required for said generating step.

3. The method of claim 1 further including the step of:
   triggering said dual-ended write to said memory cell.

4. The method of claim 3 wherein said triggering step includes firing a WORD line.

5. The method of claim 1 wherein said generating step further includes using a NFET to generate said complementary data carrier.

6. The method of claim 5 wherein said NFET is arranged to generate said complementary data carrier having a low voltage value when said data carrier has a high voltage value and a WORD line is fired to trigger said dual-ended write to said memory cell.

7. The method of claim 1 wherein said memory cell includes cross-coupled inverters for storing a bit of data.

8. A register structure comprising:
   memory cell capable of storing one bit of data;
   first means for performing a dual-ended write of a data value from a first port to said memory cell; and
   means for generating a complementary data carrier, wherein said generating means does not comprise an inverter.

9. The register structure of claim 8 wherein said generating means does not include a PFET.

10. The register structure of claim 8 wherein said generating means includes a gate arranged to generate a complementary data carrier having a low voltage value when a data carrier is set to a high voltage value to be written to the memory cell.

11. The register structure of claim 10 wherein said gate is arranged to generate a complementary data carrier having a low voltage value when said data carrier is set to a high voltage value and a WORD line is fired to trigger said dual-ended write to said memory cell.

12. The register structure of claim 8 wherein said first dual-ended writing means includes at least one NFET.

13. The register structure of claim 8 further including:
   second means for performing a dual-ended write of a data value from a second port to said memory cell.

14. The register structure of claim 13 further including:
   second means for generating a complementary data carrier for performing a dual-ended write of a data value from said second port to said memory cell, wherein said generating means does not comprise an inverter.

15. A system comprising:
   at least one processor for executing instructions;
   at least one port capable of servicing an instruction being executed by said processor, wherein a data carrier is implemented for each of said at least one port to carry, from external to a register structure, a data value to be written to said register structure and wherein a complementary data carrier is not required to carry, from external to said register structure, a value complementary to said data value to said register structure;

at least one register structure, wherein said at least one register structure comprises a memory cell capable of storing one bit of data, a dual-ended write mechanism, and a gate for generating the appropriate complementary data carrier used in performing a dual-ended write to said at least one register structure, wherein said gate does not include a PFET.

16. The system of claim 15 further including:

multiple ports capable of servicing an instruction being executed by said processor, wherein said at least one register structure is arranged to enable a dual-ended write thereto from said multiple ports.

17. The system of claim 15 wherein said system is a computer system.

18. The system of claim 15 wherein said gate is arranged to generate said complementary data carrier having a low voltage value when a data carrier for said at least one port is set to a high voltage value to be written from said at least one port to said memory cell.

19. The method of claim 1 wherein said setting step comprises:

setting, external to said register structure, a single data carrier for a port to carry a data value to be written from said port to said memory cell, and wherein a complementary data carrier is not required to be set external to said register structure and carried from said port to said register structure.

20. The register structure of claim 8 wherein a single data carrier utilized to carry a data value to be written from said first port to said register structure is set to said data value external to said register structure, and wherein a value complementary to said data value is not required to be generated external to said register structure and carried to said register structure.

* * * * *